United States Patent
Takahashi et al.

(10) Patent No.: US 10,460,949 B2
(45) Date of Patent: Oct. 29, 2019

(54) SUBSTRATE PROCESSING APPARATUS, SUBSTRATE PROCESSING METHOD AND STORAGE MEDIUM

(71) Applicant: TOKYO ELECTRON LIMITED, Tokyo (JP)

(72) Inventors: Hiroyuki Takahashi, Nirasaki (JP); Kazunori Kazama, Nirasaki (JP); Noriyuki Iwabuchi, Nirasaki (JP); Satoshi Toda, Nirasaki (JP); Tetsuro Takahashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 61 days.

(21) Appl. No.: 14/886,325

(22) Filed: Oct. 19, 2015

(65) Prior Publication Data

US 2016/0111304 A1 Apr. 21, 2016

(30) Foreign Application Priority Data

Oct. 20, 2014 (JP) .................................. 2014-213887
Feb. 26, 2015 (JP) .................................. 2015-036889
Sep. 16, 2015 (JP) .................................. 2015-182489

(51) Int. Cl.
*H01L 21/3065* (2006.01)
*C23C 16/455* (2006.01)
(Continued)

(52) U.S. Cl.
CPC ...... *H01L 21/3065* (2013.01); *C23C 16/4412* (2013.01); *C23C 16/45557* (2013.01);
(Continued)

(58) Field of Classification Search
None
See application file for complete search history.

(56) References Cited

U.S. PATENT DOCUMENTS 5,639,309 A * 6/1997 Akimoto ........... H01J 37/32192
 118/723 E
5,855,681 A * 1/1999 Maydan ............ H01L 21/67167
 118/719

(Continued)

FOREIGN PATENT DOCUMENTS

JP 2003-049278 A 2/2003
JP 2010-80924 A 4/2010
JP 2011-529136 A 12/2011

*Primary Examiner* — Karla A Moore
(74) *Attorney, Agent, or Firm* — Nath, Goldberg & Meyer; Jerald L. Meyer

(57) ABSTRACT

There is provided a substrate processing apparatus of performing a predetermined substrate process on a plurality of target substrates under a vacuum atmosphere, including: a plurality of processing parts each configured to perform the substrate process on each of the plurality of target substrates; a gas supply mechanism configured to supply a processing gas to each of the plurality of processing parts; a single exhaust mechanism configured to exhaust the processing gas within the plurality of processing parts; and a control part configured to control the single exhaust mechanism to collectively exhaust the processing gas within the plurality of processing parts, and control the gas supply mechanism to separately supply the processing gas into each of the plurality of processing parts such that a difference between internal pressures of the plurality of processing parts is prevented.

10 Claims, 9 Drawing Sheets

(51) Int. Cl.
   *C23C 16/52* (2006.01)
   *C23C 16/44* (2006.01)
   *H01L 21/67* (2006.01)
   *H01L 21/311* (2006.01)

(52) U.S. Cl.
   CPC ........ *C23C 16/45561* (2013.01); *C23C 16/52* (2013.01); *H01L 21/67017* (2013.01); *H01L 21/6719* (2013.01); *H01L 21/31116* (2013.01)

(56) References Cited

U.S. PATENT DOCUMENTS

| | | | | |
|---|---|---|---|---|
| 6,495,233 | B1* | 12/2002 | Shmurun | C23C 16/455 |
| | | | | 118/713 |
| 6,962,644 | B2* | 11/2005 | Paterson | H01J 37/32082 |
| | | | | 118/719 |
| 7,276,122 | B2* | 10/2007 | Devine | H01L 21/6719 |
| | | | | 118/719 |
| 8,366,829 | B2* | 2/2013 | Yin | H01J 37/32091 |
| | | | | 118/719 |
| 2003/0085205 | A1* | 5/2003 | Lai | H01J 37/32431 |
| | | | | 219/121.43 |
| 2010/0193132 | A1* | 8/2010 | Wi | H01L 21/6719 |
| | | | | 156/345.51 |
| 2011/0031214 | A1* | 2/2011 | Kim | C23C 16/4412 |
| | | | | 216/59 |
| 2014/0033978 | A1* | 2/2014 | Adachi | C23C 16/45542 |
| | | | | 118/696 |

\* cited by examiner (Reference example)

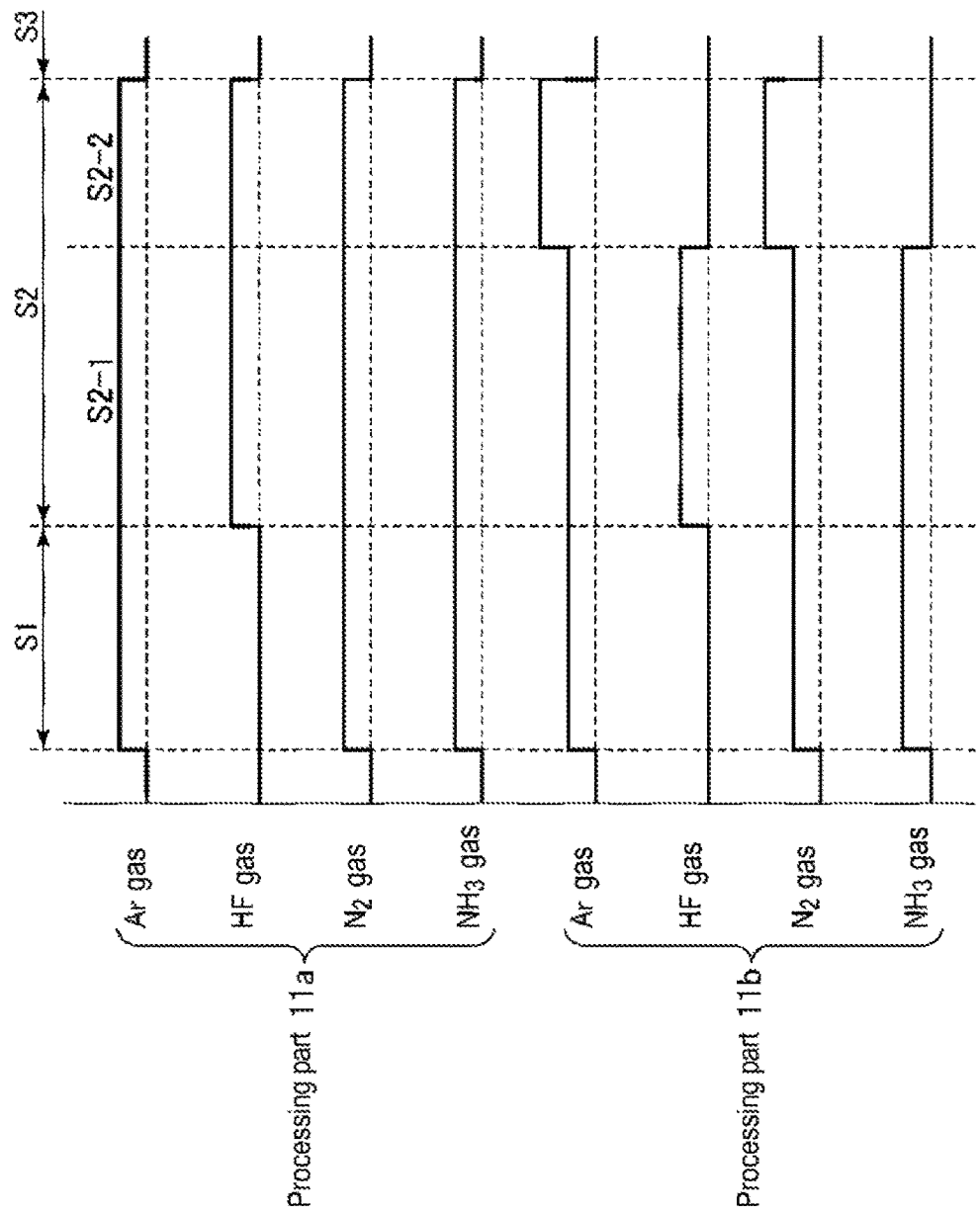

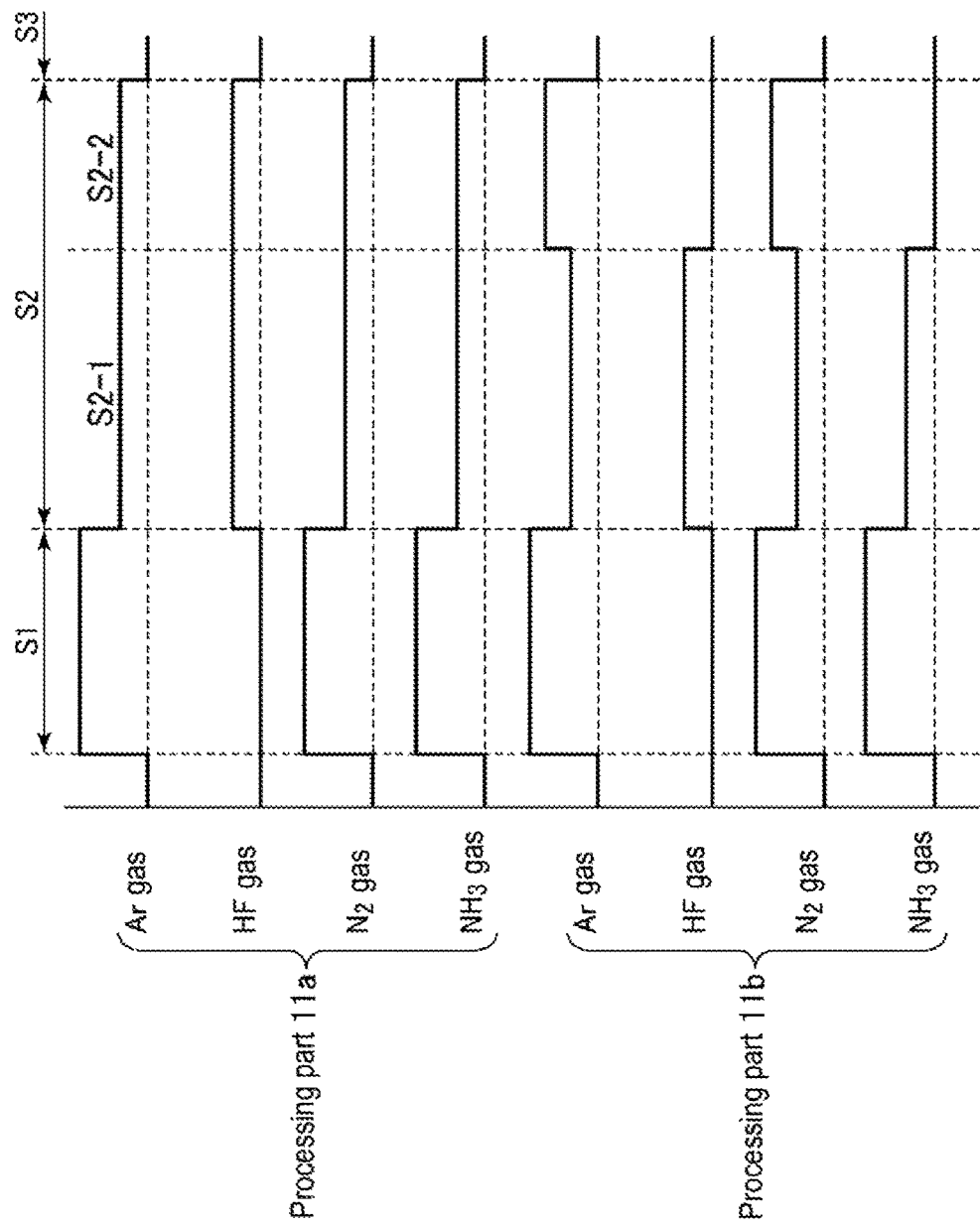

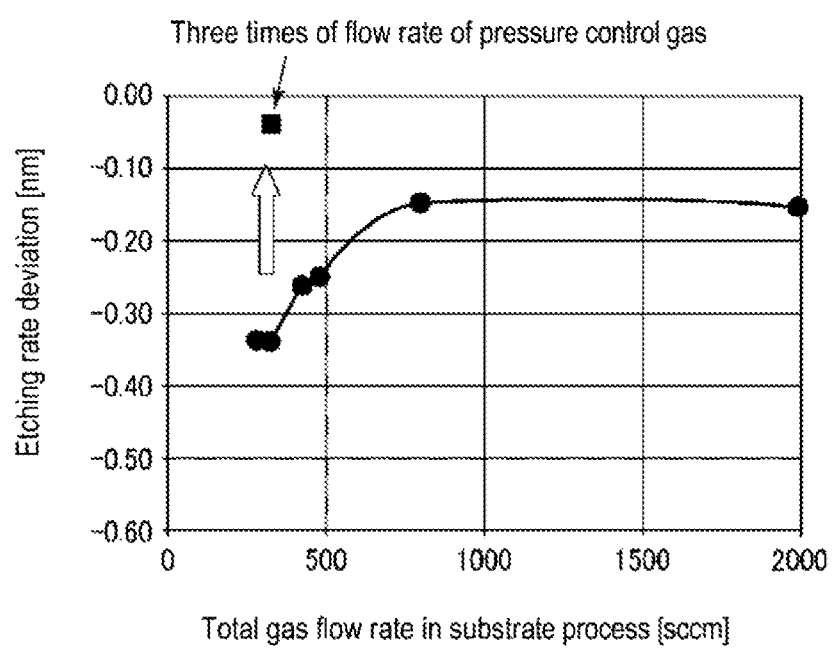

SUBSTRATE PROCESSING APPARATUS, SUBSTRATE PROCESSING METHOD AND STORAGE MEDIUM

CROSS-REFERENCE TO RELATED APPLICATIONS

This application claims the benefit of Japanese Patent Application Nos. 2014-213887, 2015-036889 and 2015-182489, filed on Oct. 20, 2014, Feb. 26, 2015 and Sep. 16, 2015, respectively, in the Japan Patent Office, the disclosure of which is incorporated herein in their entirety by reference.

TECHNICAL FIELD

The present disclosure relates to a substrate processing apparatus and a method therefor, which perform a substrate process on a target substrate.

BACKGROUND

Semiconductor devices are manufactured by repeatedly performing various processes such as an etching process, a film forming process and the like on a semiconductor wafer (hereinafter simply to as a "wafer") used as a target substrate.

A single type processing apparatus for processing target substrates one by one has been often used as a substrate processing apparatus. However, since such a substrate processing apparatus is required to improve throughput, a substrate processing apparatus for performing the substrate process on two or more target substrates at once while maintaining a platform of the single type processing apparatus, has also been used.

In such a substrate processing apparatus, a substrate mounting table on which a plurality of target substrates is mounted is installed within a chamber. On the substrate mounting table, a plurality of process regions and separation regions by which the plurality of process regions is separated are alternately defined along a circumferential direction of the substrate mounting table. During the substrate process, the substrate mounting table is rotated such that the plurality of target substrates passes through the process regions and the separation regions in a sequential order of "the process region, the separation region, the process region, the separation region, . . . ." Thus, the plurality of target substrates is subjected to the substrate process under different gas supply conditions.

In the related art, in order to perform the substrate process on the plurality of target substrates under different gas supply conditions, exhaust mechanisms are separately installed with respect to respective process regions. This increases manufacturing costs of the substrate processing apparatus.

SUMMARY

Some embodiments of the present disclosure provide a substrate processing apparatus and a method therefor, which are capable of performing a substrate process on a plurality of target substrates loaded into a plurality of processing parts under different gas supply conditions, using a single exhaust mechanism.

According to one embodiment of the present disclosure, there is provided a substrate processing apparatus of performing a predetermined substrate process on a plurality of target substrates under a vacuum atmosphere, including: a plurality of processing parts each configured to perform the substrate process on each of the plurality of target substrates; a gas supply mechanism configured to separately supply a processing gas to each of the plurality of processing parts; a single exhaust mechanism configured to collectively exhaust a processing gas within the plurality of processing parts; and a control part configured to control the gas supply mechanism and the single exhaust mechanism, wherein the control part controls the single exhaust mechanism to collectively exhaust the processing gas within the plurality of processing parts, and controls the gas supply mechanism to separately supply the processing gas into each of the plurality of processing parts such that a difference between internal pressures of the plurality of processing parts is prevented.

According to another embodiment of the present disclosure, there is provided a substrate processing method of performing a predetermined substrate process on a plurality of target substrates under a vacuum atmosphere using a substrate processing apparatus which includes a plurality of processing parts each configured to perform the substrate process on each of the plurality of target substrates, a gas supply mechanism configured to separately supply a gas into each of the plurality of processing parts, and a single exhaust mechanism configured to collectively exhaust a gas within the plurality of processing parts, the method including: collectively exhausting, by the single exhaust mechanism, a processing gas within the plurality of processing parts; and separately supplying, by the gas supply mechanism, the processing gas into the plurality of processing parts such that a difference between internal pressures of the plurality of processing parts is prevented.

According to yet another embodiment of the present disclosure, there is provided a substrate processing method of performing a predetermined substrate process on a plurality of target substrates under a vacuum atmosphere using a substrate processing apparatus which includes a plurality of processing parts each configured to perform the substrate process on each of the plurality of target substrates, a gas supply mechanism configured to separately supply a gas into each of the plurality of processing parts and a single exhaust mechanism configured to collectively exhaust a gas within the plurality of processing parts, the method including: executing a first mode in which the processing gas within the plurality of processing parts is collectively exhausted and a first gas as the processing gas is supplied into all the plurality of processing parts under the same gas supply condition; and executing a second mode in which the single exhaust mechanism is controlled to collectively exhaust the processing gas within the plurality of processing parts and the gas supply mechanism is controlled to supply the first gas into some of the plurality of processing parts and to supply a second gas different from the first gas into the other of the plurality of processing parts such that a difference between internal pressures of the plurality of processing parts is prevented.

According to still another embodiment of the present disclosure, there is provided a non-transitory storage medium storing a program that operates on a computer and controls a substrate processing apparatus, wherein the program, when executed, causes the computer to control the substrate processing apparatus so as to perform the aforementioned substrate processing method.

BRIEF DESCRIPTION OF THE DRAWINGS

The accompanying drawings, which are incorporated in and constitute a part of the specification, illustrate embodi

FIG. 5 is a view showing an example of a sequence in the substrate processing apparatus of FIG. 1.

FIG. 6 is a view showing another example of a sequence in the substrate processing apparatus of FIG. 1.

FIG. 7 is a view showing results obtained by the sequence of FIG. 6.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Substrate Processing Apparatus>

Figure 1:
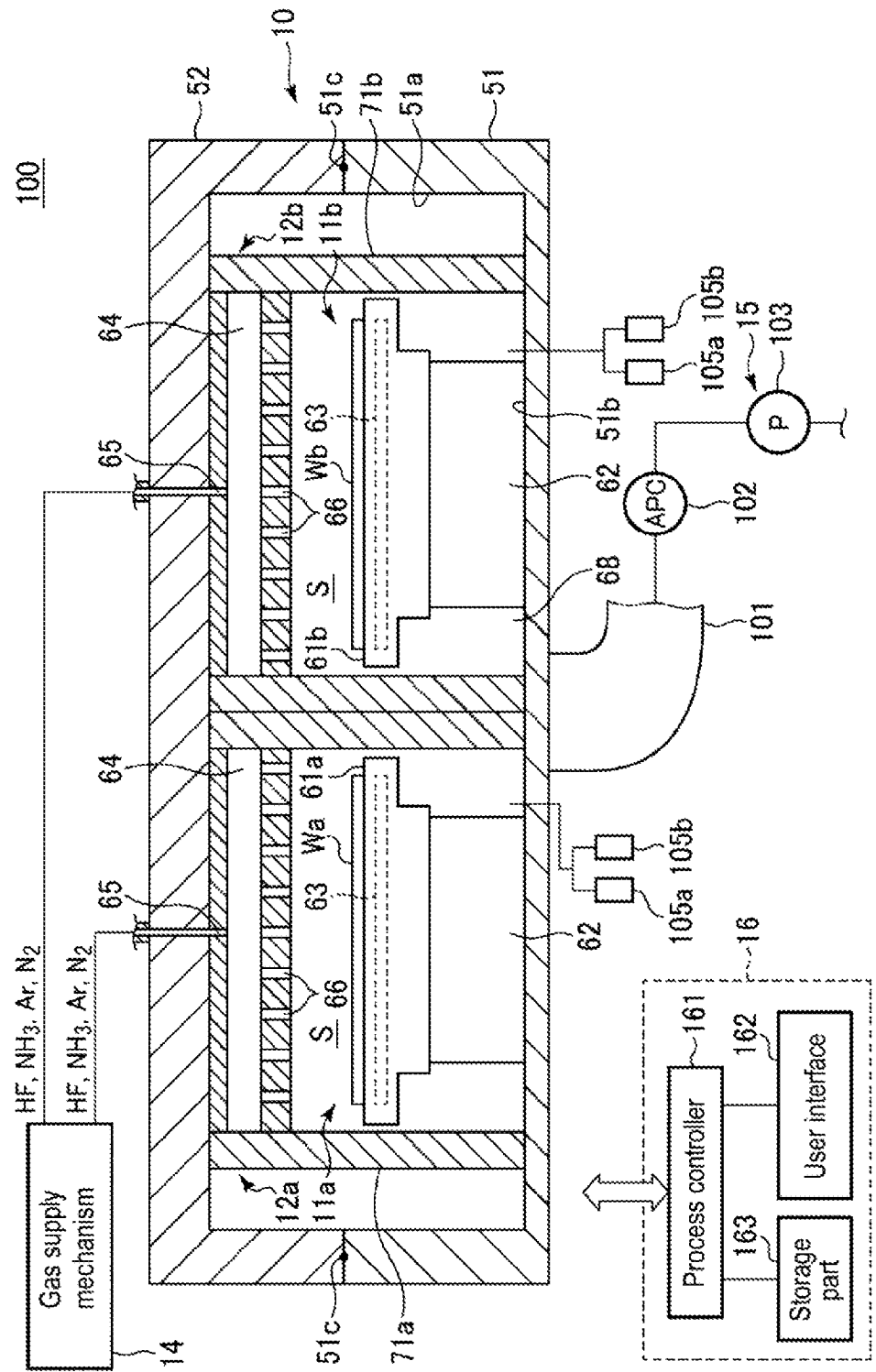
- FIG. 1 is a cross-sectional view showing an example of a substrate processing apparatus in accordance with an embodiment of the present disclosure.

FIG. 1 is a cross-sectional view showing an example of a substrate processing apparatus in accordance with an embodiment of the present disclosure. In FIG. 1, a chemical oxide removal (COR) processing apparatus 100 which performs a COR process is shown as an example of the substrate processing apparatus. In general, such a COR process includes performing a substrate process by supplying an HF-containing gas and an $NH_3$-containing gas onto an oxide film formed on a surface of a substrate (e.g., a silicon wafer) within a chamber; and removing the oxide film from the surface of the silicon wafer.

As shown in FIG. 1, the COR processing apparatus 100 includes a chamber 10 having a sealed structure. The chamber 10, which is made of, e.g., aluminum or aluminum alloy, includes a chamber main body 51 and a cover member 52. The chamber main body 51 includes a sidewall portion 51a and a bottom portion 51b. An upper portion of the chamber main body 51 is opened. This opening is covered by the cover member 52. The sidewall portion 51a and the cover member 52 are sealed by a seal member 51c, thereby securing airtightness within the chamber 10.

Two processing parts 11a and 11b configured to perform the substrate process on a plurality of target substrates is installed within the chamber 10. The processing parts 11a and 11b includes substrate mounting tables 61a and 61b, respectively. Wafers Wa and Wb (hereinafter, simply referred to sometimes as "wafer W") used as the target substrates are respectively mounted on the substrate mounting tables 61a and 61b in a horizontal posture. Gas introduction members 12a and 12b through which processing gases are introduced into the chamber 10 are installed at upper portions of the substrate mounting tables 61a and 61b, respectively. The gas introduction members 12a and 12b are installed inside the cover member 52. The gas introduction member 12a and the gas introduction member 12b are disposed to face the substrate mounting table 61a and the substrate mounting table 61b, respectively. Further, a cylindrical inner wall 71a is installed to surround the gas introduction member 12a and the substrate mounting table 61a, and a cylindrical inner wall 71b is installed to surround the gas introduction member 12b and the substrate mounting table 61b. The inner walls 71a and 71b are installed to extend from an inner wall of a top portion of the cover member 52 to the bottom portion 51b of the chamber main body 51. Upper portions of the inner walls 71a and 71b constitute sidewalls of the gas introduction member 12a and 12b, respectively. A space between the gas introduction member 12a and the substrate mounting table 61a, and a space between the gas introduction member 12b and the substrate mounting table 61b are substantially sealed by the inner walls 71a and 71b, respectively. There spaces are defined as process spaces S in which the substrate process is performed on the wafers Wa and Wb.

Further, in the outside of the chamber 10, a gas supply mechanism 14 configured to supply gases to the gas introduction members 12a and 12b, an exhaust mechanism 15 configured to exhaust the inside of the chamber 10, and a control part 16 configured to control the COR processing apparatus 100 are installed.

A loading/unloading port (not shown) through which the wafer W is loaded into or unloaded from the chamber 10 is formed in the sidewall portion 51a of the chamber main body 51. The loading/unloading port is opened and closed by a gate valve (not shown). Further, loading/unloading ports (not shown) are formed in the inner walls 71a and 71b. These loading/unloading ports are opened and closed by respective shutters (not shown).

Each of the processing parts 11a and 11b has an approximately circular shape. The substrate mounting tables 61a and 61b are supported by respective base blocks 62. These base blocks 62 are fixed to the bottom portion 51b of the chamber main body 51. Temperature controllers 63 configured to control a temperature of each of the wafers W are embedded in the substrate mounting tables 61a and 61b, respectively. For example, each of the temperature controllers 63 includes a pipeline through which a temperature control medium (e.g., water) circulates. By heat exchange between each of the substrate mounting tables 61a and 61b and the temperature control medium flowing through each of the pipelines, the temperature of each of the wafers W is controlled. Further, a plurality of elevating pins (not shown) used when transferring the wafer W is installed in each of the substrate mounting tables 61a and 61b such that they can project from or retract into a surface of each of the substrate mounting tables 61a and 61b on which the wafer is mounted.

The gas supply mechanism 14 is configured to supply the processing gases such as an HF gas, an NH$_3$ gas or the like, and inert gases (dilution gases) such as an Ar gas, an N$_2$ gas or the like, into each of the processing parts 11a and 11b through each of the gas introduction members 12a and 12b. The gas supply mechanism 14 includes supply sources, supply pipes, valves, and flow rate controllers represented by mass flow controllers, which are associated with the gases.

Figure 2:
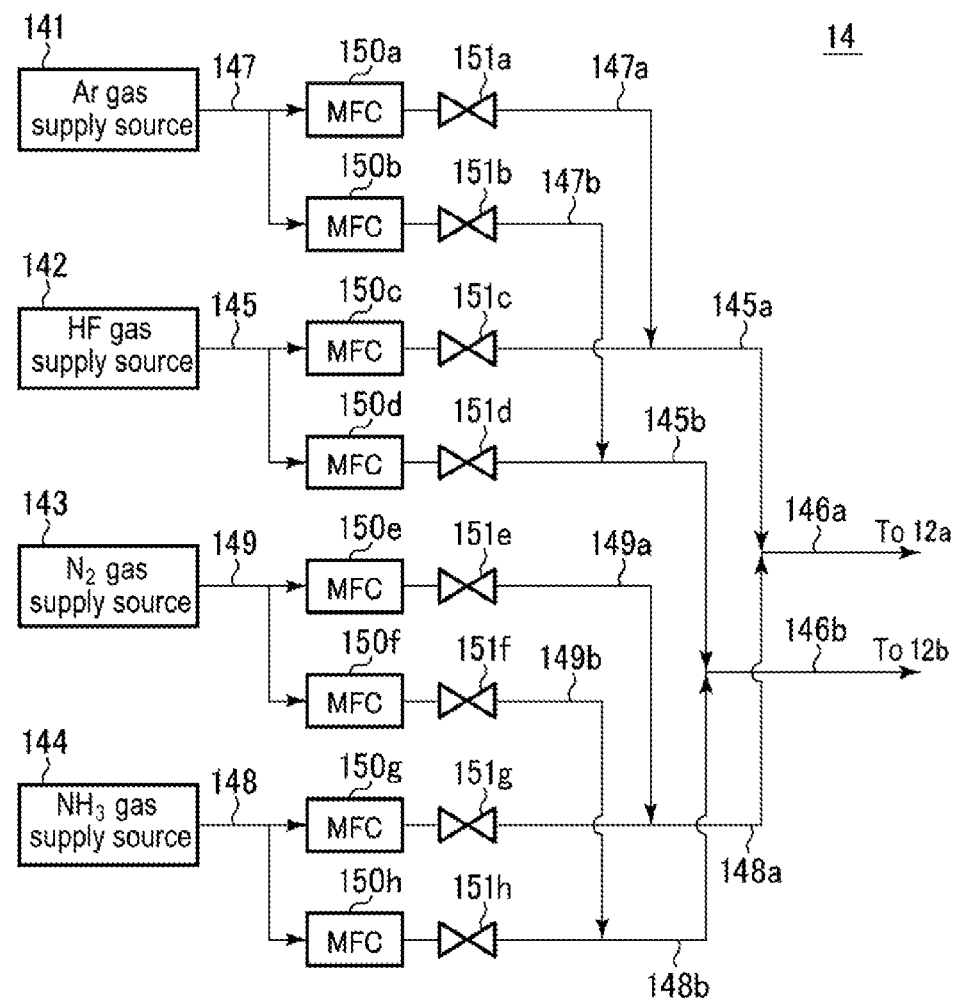
FIG. 2 is a view showing an example of a configuration of a gas supply mechanism.

FIG. 2 is a view showing an example of a configuration of the gas supply mechanism 14.

As shown in FIG. 2, the gas supply mechanism 14 includes, as gas supply sources, an Ar gas supply source 141, an HF gas supply source 142, an N$_2$ gas supply source 143, and an NH$_3$ gas supply source 144.

In this embodiment, the HF gas supplied from the HF gas supply source 142 is diluted with the Ar gas supplied from the Ar gas supply source 141 so that the diluted gas is supplied to each of the gas introduction members 12a and 12b. Likewise, the NH$_3$ gas supplied from the NH$_3$ gas supply source 144 is diluted with the N$_2$ gas supplied from the N$_2$ gas supply source 143 so that the diluted gas is supplied to each of the gas introduction members 12a and 12b.

An HF gas supply pipe 145 through which the HF gas passes is branched into two HF gas supply pipes 145a and 145b. The HF gas supply pipe 145a is connected to a supply pipe 146a which is connected to the gas introduction member 12a. The HF gas supply pipe 145b is connected to a supply pipe 146b which is connected to the gas introduction member 12b. Similarly, an Ar gas supply pipe 147 through which the Ar gas passes is branched into two Ar gas supply pipes 147a and 147b which are connected to the respective HF gas supply pipes 145a and 145b. Thus, the HF gas can be diluted with the Ar gas.

Likewise, an NH$_3$ gas supply pipe 148 through which the NH$_3$ gas passes is branched into two NH$_3$ gas supply pipes 148a and 148b which are connected to the respective supply pipes 146a and 146b. An N$_2$ gas supply pipe 149 through which the N$_2$ gas passes is branched into two N$_2$ gas supply pipes 149a and 149b which are connected to the respective NH$_3$ gas supply pipes 148a and 148b. Thus, the NH$_3$ gas can be diluted with the N$_2$ gas.

Further, the Ar gas and the N$_2$ gas has been described to be used as the dilution gases, but may be used as purge gases or supplement gases which are used in controlling a pressure (which will be described later).

Mass flow controllers (MFCs) 150a to 150h and on-off valves 151a to 151h for opening and closing the respective supply pipes are installed in the HF gas supply pipes 145a and 145b, the Ar gas supply pipes 147a and 147b, the NH$_3$ gas supply pipes 148a and 148b, and the N$_2$ gas supply pipes 149a and 149b, respectively. The MFCs 150a to 150h and the on-off valves 151a to 151h are controlled by the control part 16 independently of each other.

As an example, when the general COR process is performed in the processing parts 11a and 11b, both the HF gas and the NH$_3$ gas are supplied to each of the gas introduction members 12a and 12b. In this case, the control part 16 controls the respective on-off valves to be opened as described in the following "Case A."

[Case A]
<For the gas introduction member 12a>
On-off valve 151a (Ar gas): opened
On-off valve 151c (HF gas): opened
On-off valve 151e (N$_2$ gas): opened
On-off valve 151g (NH$_3$ gas): opened <For the gas introduction member 12b>
On-off valve 151b (Ar gas): opened
On-off valve 151d (HF gas): opened
On-off valve 151f (N$_2$ gas): opened
On-off valve 151h (NH$_3$ gas): opened In some embodiments, different gas supply conditions in which the gases are supplied into the processing parts 11a and 11b through the gas introduction members 12a and 12b may be applied. As an example, gas supply conditions as described in the following "Case B" and "Case C" may be applied.

[Case B]
<For the gas introduction member 12a>
On-off valve 151a (Ar gas): opened
On-off valve 151c (HF gas): opened
On-off valve 151e (N$_2$ gas): opened
On-off valve 151g (NH$_3$ gas) opened
<For the gas introduction member 12b>
On-off valve 151b (Ar gas): opened
On-off valve 151d (HF): closed
On-off valve 151f (N$_2$ gas): opened
On-off valve 151h (NH$_3$ gas): closed

[Case C]
<For the gas introduction member 12a>
On-off valve 151a (Ar gas): opened
On-off valve 151c (HF gas): closed
On-off valve 151e (N$_2$ gas): opened
On-off valve 151g (NH$_3$ gas): closed
<For the gas introduction member 12b>
On-off valve 151b (Ar gas): opened
On-off valve 151d (HF gas): opened
On-off valve 151f (N$_2$ gas): opened
On-off valve 151h (NH$_3$ gas): opened That is to say, in Case B, the on-off valve 151d and the on-off valve 151h which have been opened in Case A are closed to stop the supply of the HF gas and the NH$_3$ gas (used as the processing gases) to the gas introduction member 12b, and only the Ar gas and the N$_2$ gas are supplied to the gas introduction member 12b. Thus, the HF gas and the NH$_3$ gas used as the processing gases continue to be supplied to the gas introduction member 12a. Meanwhile, in Case C, the supply of the HF gas and the NH$_3$ gas to the gas introduction member 12a is stopped, and the HF gas and the NH$_3$ gas used as the processing gases continue to be supplied to the gas introduction member 12b.

With this configuration, in Case B, the HF gas and the NH$_3$ gas, together with the Ar gas and the N$_2$ gas used as the inert gases, are supplied into the processing part 11a through the gas introduction member 12a, while only the Ar gas and the N$_2$ gas used as the inert gases are supplied into the processing part 11b through the gas introduction member 12b. Meanwhile, in Case C, the HF gas and the NH$_3$ gas, together with the Ar gas and the N$_2$ gas used as the inert gases, are supplied into the processing part 11b through the gas introduction member 12b, while only the Ar gas and the N$_2$ gas used as the inert gases are supplied into the processing part 11a through the gas introduction member 12a. That is to say, during the COR process, the different gas supply conditions can be simultaneously applied to the processing part 11a and the processing part 11b. A substrate process mode implemented by controlling the on-off valves will be described in detail later.

The gas introduction members 12a and 12b are configured to introduce the gases supplied from the gas supply mechanism 14 to the chamber 10 such that the gases are supplied into the processing parts 11a and 11b, respectively. Each of the gas introduction members 12a and 12b includes a gas diffusion space 64 defined therein and generally has a cylindrical shape. A gas introduction hole 65, which penetrates through the upper wall of the chamber 10, is formed in an upper surface of each of the gas introduction members 12a and 12b. A plurality of gas discharge holes 66 which is in communication with the gas diffusion space 64, is formed in a lower surface of each of the gas introduction members 12a and 12b. Further, the gases such as the HF gas, the $NH_3$ gas and the like supplied from the gas supply mechanism 14, flow through the gas introduction hole 65 and are introduced into the gas diffusion space 64 where the gases are diffused. The diffused gases are uniformly discharged through the gas discharge holes 66 in a shower form. That is to say, each of the gas introduction members 12a and 12b functions as a gas dispersion head (a shower head) for dispersing and discharging the gases. In some embodiments, each of the gas introduction members 12a and 12b may be configured in a post-mix type in which the HF gas and the $NH_3$ gas are introduced into the chamber 10 through different passages, and subsequently, are mixed with each other within the chamber 10.

The exhaust mechanism 15 includes an exhaust pipe 101 which is connected to an exhaust port (not shown) formed in the bottom portion 51b of the chamber 10. The exhaust mechanism 15 further includes an automatic pressure control valve (APC) 102 configured to control an internal pressure of the chamber 10 and a vacuum pump (P) 103 configured to exhaust the inside of the chamber 10, which are installed in the exhaust pipe 101. The exhaust port is formed outside the inner walls 71a and 71b. In lower portions of the inner walls 71a and 71b below the substrate mounting tables 61a and 61b, a plurality of slits is formed to exhaust the interior of each of the processing parts 11a and 11b by the exhaust mechanism 15. With this configuration, the processing parts 11a and 11b are collectively exhausted by the exhaust mechanism 15. Further, the APC 102 and the vacuum pump 103 are shared by the processing parts 11a and 11b.

Further, capacitance manometers 105a and 105b used as pressure gauges which are configured to measure the internal pressure of the chamber 10, are installed to be inserted into the exhaust space 68 through the bottom portion 51b of the chamber 10. The capacitance manometer 105a is used to measure a high pressure and the capacitance manometer 105b is used to measure a low pressure. An opening degree of the APC 102 is controlled based on a pressure value detected at the capacitance manometer 105a or 105b.

The control part 16 includes a process controller 161 provided with a microprocessor (computer) which controls respective components of the COR processing apparatus 100. A user interface 162, which includes a keyboard or a touch panel display that allows an operator to perform a command input operation or the like in order to manage the COR processing apparatus 100, a display that visually displays an operation status of the COR processing apparatus 100 and the like, is connected to the process controller 161. Also connected to the process controller 161 is a storage part 163 which stores: control programs for realizing, under the control of the process controller 161, various types of processes performed in the COR processing apparatus 100, process recipes which are control programs for allowing the respective components of the COR processing apparatus 100 to perform specified processes according to process conditions; and various types of databases. The process recipes are stored in a suitable storage medium (not shown) of the storage part 163. If necessary, an arbitrary recipe is called out from the storage part 163 and is executed by the process controller 161. In this way, desired processes are performed in the COR processing apparatus 100 under the control of the process controller 161.

Further, in this embodiment, the control part 16 features controlling the MFCs 150a to 150h and the on-off valves 151a to 151h of the gas supply mechanism 14 independently of each other as described above.

<Substrate Process Operation>

Next, an operation of the substrate processing apparatus configured as above will be described.

Figure 3A:
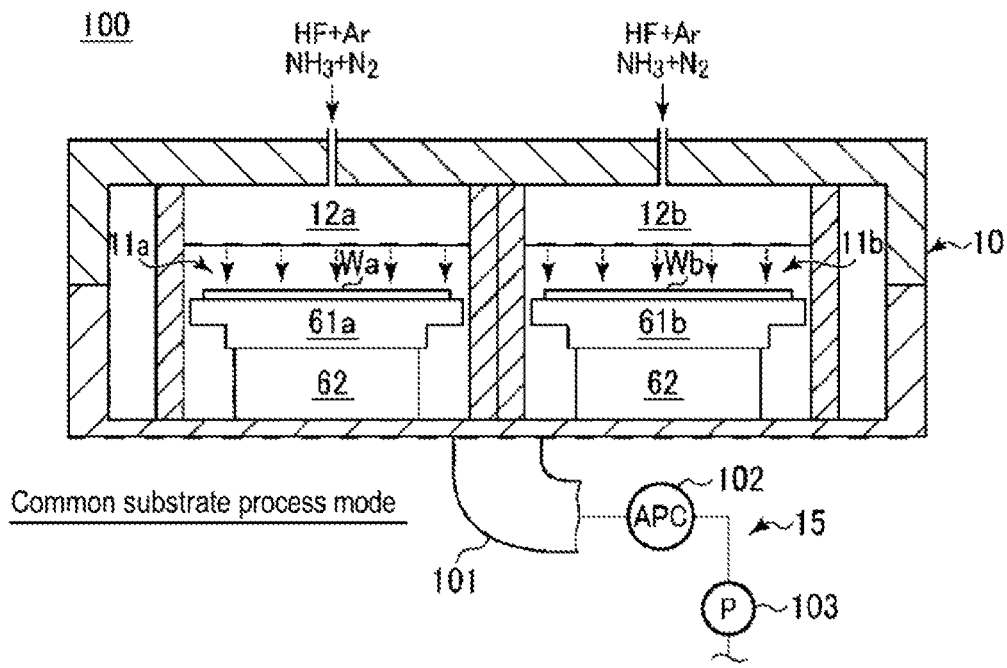
FIG. 3A is a view schematically showing a common substrate process mode performed by the substrate processing apparatus in accordance with the embodiment of the present disclosure.
Figure 3B:
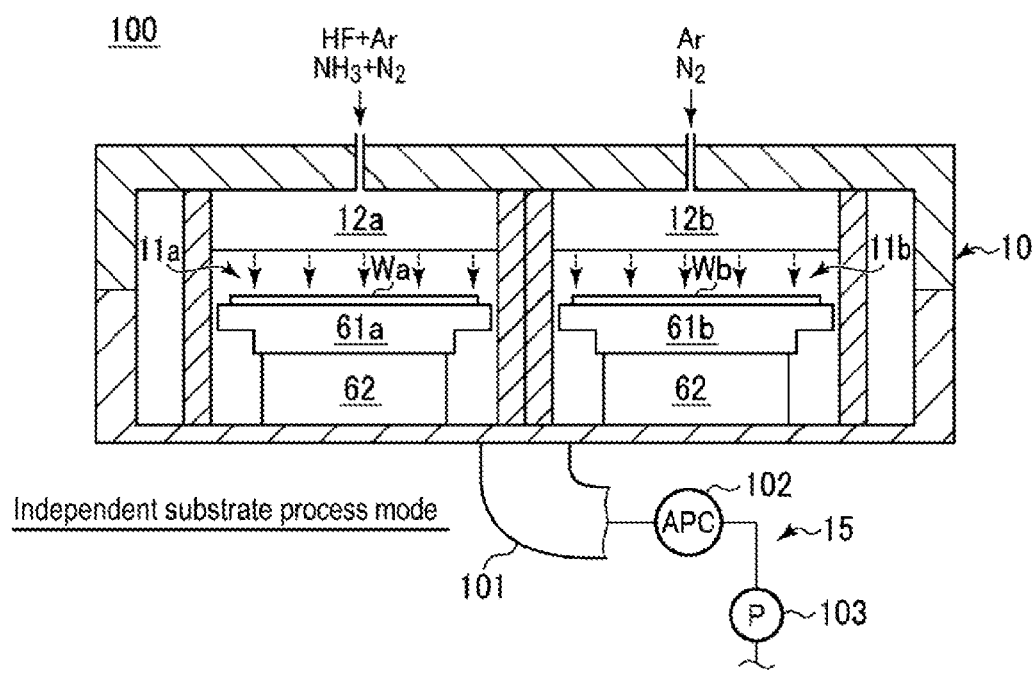
FIG. 3B is a view schematically showing an independent substrate process mode performed by the substrate processing apparatus in accordance with the embodiment of the present disclosure.

FIG. 3A is a view schematically showing an example of a substrate process operation performed by the COR processing apparatus 100 in accordance with an embodiment of the present disclosure. FIG. 3B is a view schematically showing another example of the substrate process operation performed by the COR processing apparatus 100 in accordance with an embodiment of the present disclosure.

Two sheets of the wafers Wa and Wb having a target etching film (e.g., an $SiO_2$ film) formed on a surface thereof are respectively loaded into the processing parts 11a and 11b of the chamber 10, and subsequently, are mounted on the substrate mounting table 61a and the substrate mounting table 61b, respectively. Thereafter, the internal pressure of the chamber 10 is controlled to a predetermined pressure by the exhaust mechanism 15. In this way, a pressure stabilization step in which the internal pressure of the chamber 10 is stabilized, is performed. Subsequently, a substrate process step is performed. Since the processing parts 11a and 11b share the exhaust mechanism 15, the control of the internal pressure in both the pressure stabilization step and the substrate process step is performed by the common APC 102.

The substrate process step is performed in a common substrate process mode shown in FIG. 3A or an independent substrate process mode shown in FIG. 3B.

(Common Substrate Process Mode)

A state shown in FIG. 3A relates to a process performed in the common substrate process mode. In this common substrate process mode, the wafers Wa and Wb are subjected to the substrate process under the same gas supply conditions. In the common substrate process mode, the COR process is performed on both the processing parts 11a and 11b. In this mode, each of the on-off valves 151a to 151h is set as described in Case A. With this configuration, as shown in FIG. 3A, the HF gas and the $NH_3$ gas, while being respectively diluted with the Ar gas and the $N_2$ gas used as the inert gases, are supplied onto the wafers Wa and Wb through the gas introduction members 12a and 12b such that the wafers Wa and Wb are subjected to the same substrate process.

(Independent Substrate Process Mode)

A state shown in FIG. 3B relates to a process performed in the independent substrate process mode. In this independent substrate process mode, the wafers Wa and Wb are subjected to the substrate process under different gas supply conditions. In this mode, each of the on-off valves 151a to 151h is set as described in Case B, for example. With this configuration, as shown in FIG. 3B, the HF gas and the $NH_3$ gas which are respectively diluted with the Ar gas and the $N_2$ gas, are supplied onto the wafer Wa of the processing part 11a through the gas introduction member 12a, while only the Ar gas and the $N_2$ gas are supplied onto the wafer Wb of the processing part 11b through the gas introduction member 12b. As a result, the wafers Wa and Wb are subjected to different substrate processes. That is to say, the substrate process based on the HF gas and the $NH_3$ gas is performed on the wafer Wa in the processing part 11a, while the supply of the HF gas and the NH₃ gas to the wafer Wb in the processing part 11b is stopped. Further, in some embodiments, the inert gas introduced through the gas introduction member 12b may be any one of the Ar gas and the N₂ gas.

Further, in some embodiments, on the contrary to FIG. 3B, in the independent substrate process mode, the substrate process based on the HF gas and the NH₃ gas may be performed on the wafer Wb in the processing part 11b, while the supply of the HF gas and the NH₃ gas to the wafer Wa in the processing part 11a may be stopped. In this case, each of the on-off valves 151a to 151h is set as described in Case C, for example.

The independent substrate process mode may be effectively applied in performing the COR process on the wafers Wa and Wb in the processing parts 11a and 11b under the same gas supply condition (the common substrate process mode), and subsequently, initially terminating the COR process applied to, e.g., the processing part 11b.

Figure 4:
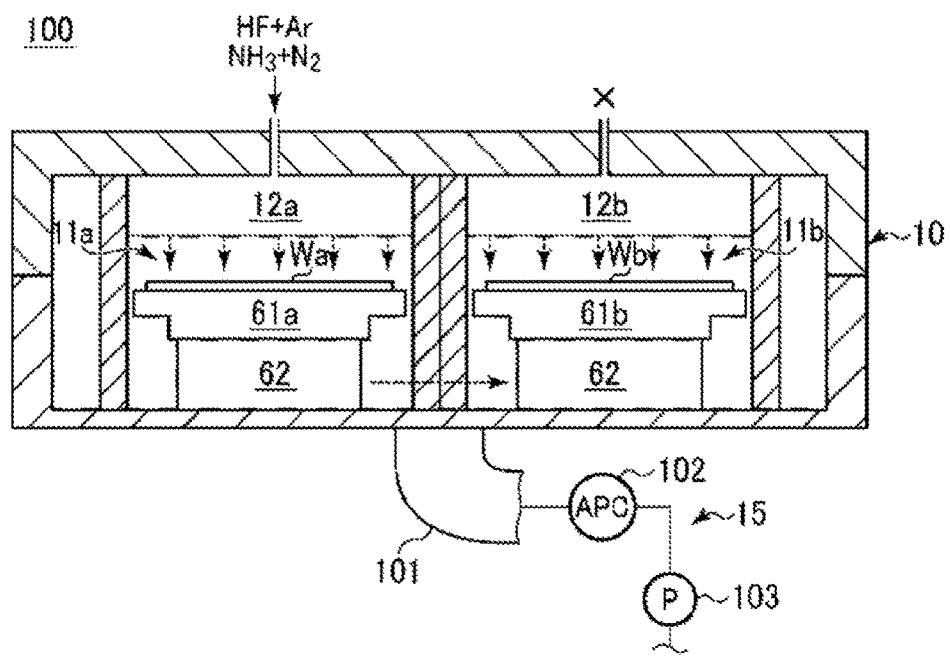
FIG. 4 is a view schematically showing a substrate process mode according to a reference example.

For example, as shown in a reference example of FIG. 4, it may be contemplated that, in the independent substrate process mode, the supply of the HF gas and NH₃ gas to the processing part 11b is stopped and any subsequent gas is not supplied into the processing part 11b through the gas introduction member 12b, thus stopping the substrate process for the processing part 11b. However, since the exhaust mechanism 15 is common to the processing parts 11a and 11b, and the internal pressure of the chamber 10 is controlled by the common APC 102, when the gases continue to be supplied to the gas introduction member 12a while stopping the supply of the gases to the gas introduction member 12b, a difference between internal pressures of the processing part 11a and the processing part 11b may be generated. At this time, even if the process space S of each of the processing parts 11a and 11b has a substantially sealed structure, the gases introduced into the processing part 11a through the gas introduction member 12a may flow backward into the processing part 11b through the slits formed in the lower portions of the inner walls 71a and 71b, as indicated by a dashed line in FIG. 4. This makes it difficult to completely stop the substrate process based on the HF gas and the NH₃ gas with respect to the wafer Wb in the processing part 11b. In the independent substrate process mode, the Ar gas and the N₂ gas continue to be introduced to the processing part 11b through the gas introduction member 12b, as shown in FIG. 3B. When inert gases such as the Ar gas and the N₂ gas are introduced at the same flow rates as those in the common substrate process mode, the total flow rate of the inert gases introduced into the processing part 11b in FIG. 3B is reduced compared with that in FIG. 3A. This causes the difference between the internal pressures of the processing part 11a and the processing part 11b so that the backward flow as described above is generated, thus making it difficult to completely stop the substrate process.

To address this, in this embodiment, the gas supply mechanism 14 is controlled to prevent the pressure difference from being generated between the processing part 11a and the processing part 11b, when different gas supply conditions are applied with respect to the processing part 11a and the processing part 11b in the independent substrate process mode.

As an example, the control part 16 may control the gas supply mechanism 14 to: stop the supply of the HF gas and the NH₃ gas to the gas introduction member 12b while closing the on-off valves 151d and 151h; to increase the flow rates of the Ar gas and the N₂ gas using the MFCs 150b and 150f while opening the on-off valves 151b and 151f, such that the generation of the difference between the internal pressures of the processing part 11a and the processing part 11b is prevented. In some embodiments, the internal pressures of the processing parts 11a and 11b are equal to each other. In the other words, the Ar gas and the N₂ gas are used as pressure-control supplement gases.

As described above, in order to stop the substrate process for any one of the processing parts 11a and 11b, the supply of the processing gases into a respective processing part is stopped and simultaneously the inert gases used as the pressure-control supplement gases are supplied into the respective processing part, thus controlling the internal pressure of the respective processing part. Accordingly, although the processing parts 11a and 11b are exhausted by the single exhaust mechanism 15, it is possible to suppress gases from flowing between the processing parts 11a and 11b.

(One Example of Processing Sequence)

Next, one example of a processing sequence according to this embodiment will be described with reference to FIG. 5.

First, the on-off valves 151a, 151b, 151e, 151f, 151g, and 151h are opened to supply the Ar gas, the N₂ gas, and the NH₃ gas to both the processing parts 11a and 11b at predetermined flow rates. The predetermined flow rates are equal with respect to both the processing parts 11a and 11b. Thus, each of the processing parts 11a and 11b are controlled to have a predetermined level of pressure (in a pressure stabilization step S1).

At the stabilization of the pressure, the substrate process is initiated (in a substrate process step S2). In the substrate process step S2, first, the on-off valves 151c and 151d are opened to supply the HF gas, while flowing the Ar gas, the N₂ gas and the NH₃, such that the COR process based on the HF gas and the NH₃ gas is performed in both the processing parts 11a and 11b (in a common substrate process mode S2-1). At this time, the on-off valves 151d and 151h are closed to stop the supply of the HF gas and the NH₃ into the processing part 11b such that the COR process for the processing part 11b is terminated, while continuously performing the COR process for the processing part 11a. Simultaneously, flow rates of the Ar gas and the N₂ gas to be supplied into the processing part 11b are further increased by the MFCs 150b and 150f (in an independent substrate process mode S2-2). The Ar gas and the N₂ gas whose flow rates are further increased function as the supplement gases for preventing the difference between the internal pressures of the processing part 11a and the processing part 11b. In some embodiments, an increase in the flow rates of the Ar gas and the N₂ gas (corresponding to flow rates of the supplement gases) at this time may correspond to a decrease in the flow rates of the HF gas and the NH₃, which is caused by the stop of the supply of the HF gas and the NH₃ gas.

Upon completing the COR process for the processing part 11a, all the on-off valves are closed to stop the supply of all the gases, and the process spaces S are exhausted by the exhaust mechanism 15 (in an exhaust step S3).

(Another Example of Processing Sequence)

In the aforementioned processing sequence, in the independent substrate process mode S2-2, once the supply of the processing gases (the HF gas and the NH₃ gas) to one of the processing parts 11a and 11b is stopped, the supply flow rates of the Ar gas and the N₂ gas to the respective processing part are further increased such that the Ar gas and the N₂ gas function as the supplement gases. This prevents the difference between the internal pressures of the processing part 11a and the processing part 11b, thus suppressing the gases from flowing between the processing parts 11a and 11b. However, since the processing parts 11a and 11b are in communication with each other through the slits formed in the lower portions of the inner walls 71a and 71b below the substrate mounting tables 61a and 61b, it is difficult to completely block the flow of the processing gases (the HF gas and the $NH_3$ gas) from one processing part to the other and the flow of the supplement gases (the Ar gas and the $N_2$ gas) from one processing part to the other. This causes a backward flow of tiny amounts of gases (gas reverse diffusion). When the total flow rate of the processing gases is a certain level of amount or higher, the backward flow of the tiny amounts of gases does not greatly affect an etching rate so that a desired etching process can be realized in the processing parts 11a and 11b. However, in a region in which a flow rate is low (low flow rate region), the influence of such a gas backward flow is not negligible. This causes an increased deviation in a set etching rate, thus failing to perform a desired independent substrate process in the processing parts 11a and 11b.

Meanwhile, when the flow rates of the processing gases (the HF gas and the $NH_3$ gas) and the supplement gases (the Ar gas and the $N_2$ gas) are drastically increased to prevent such a problem, the etching rate is increased. There is therefore a need to control the etching rate using a processing time, a gas flow rate ratio or the like, thus entailing a reduced process margin.

Accordingly, in another example of the processing sequence, in order to suppress the reverse diffusion of the processing gases and the supplement gases between the processing parts 11a and 11b in the independent substrate process mode S2-2 of the substrate process step S2, pressure control gases are flown at predetermined flow rates in the pressure stabilization step S1 such that the pressure control gases flow toward the exhaust mechanism 15 through the gas introduction members 12a and 12b. This effectively suppresses, in the low flow rate region, the gas backward flow (gas reverse diffusion) in the independent substrate process mode S2-2 of the substrate process step S2.

Specifically, as shown in FIG. 6, the flow rates of the Ar gas, the $N_2$ gas and the $NH_3$ gas supplied as the pressure control gases in the pressure stabilization step S1 are increased more than those in the substrate process step S2. In some embodiments, the total flow rate of the pressure control gases in the pressure stabilization step S1 may be three times or more of that in the substrate process step S2. An example of the pressure control gases may include a gas that does not contribute to the substrate process, which is a portion of the gases supplied in the substrate process step S2. In the subsequent substrate process step S2, the common substrate process mode S2-1 and the independent substrate process mode S2-2 are performed as in the processing sequence of FIG. 5. Thereafter, as in the processing sequence of FIG. 5, the supply of the gases is stopped, and the exhaust step S3 of exhausting the process spaces S using the exhaust mechanism 15 is performed.

With this configuration, it is possible to more effectively suppress, in the independent substrate process mode S2-2, the backward flow of the processing gases and the supplement gases in the low flow rate region, compared to the case where the pressure control is performed by only the supplement gases. Specifically, it is possible to further effectively suppress, even in the low flow rate region, the backward flow of the processing gases (the HF gas and the $NH_3$ gas) from the processing part 11a toward the processing part 11b which is not in process, and the backward flow of the supplement gases (the Ar gas and the $N_2$ gas) from the processing part 11b to the processing part 11a which is in process. Accordingly, it is possible to perform the substrate process while meeting etching rates in both the processing parts 11a and 11b at the set etching rates.

An experimental result obtained when actually increasing the flow rates of the pressure control gases in the pressure stabilization step S1 will be described with reference to FIG. 7. In this experiment, the pressure stabilization step S1 was performed using the COR processing apparatus 100 of FIG. 1. In the subsequent substrate process step S2, in the course of performing the substrate process on one of the processing parts, the supply of the processing gases (the HF gas and the $NH_3$ gas) to the other processing part was stopped and the introduction of the supplement gases (the Ar gas and the $N_2$ gas) to the other processing part was initiated. FIG. 7 is a view showing a relationship between a total gas flow rate in the one processing part and an etching rate deviation (i.e., a difference between an actual etching rate and a set etching rate) in the substrate process step S2. In FIG. 7, a black circle represents the etching rate deviation when flow rates of the pressure control gases (the Ar gas, the $N_2$ gas and the $NH_3$ gas) in the pressure stabilization step S1 were set to have the same as those in the substrate process step S2. The etching rate deviation tends to become higher in a region in which the total flow rate is low. That is to say, when the total flow rate was 300 sccm, the etching rate deviation was at a high level of about −0.33 nm. In FIG. 7, a black square represents the case where the flow rates of the pressure control gases were trebled. In this case, even when the total flow rate in the substrate process step S2 was 300 sccm, the etching rate deviation was at a very low level of −0.03 nm, which corresponds to a set value. This shows that an effect obtained by increasing the flow rates of the pressure control gases is manifested.

Further, as described above, when the COR process is performed on the $SiO_2$ film of the wafer using the HF gas and the $NH_3$ gas, an ammonium fluorosilicate ($(NH_4)_2SiF_6$; AFS) is generated as a reaction byproduct. As such, the wafer processed by the COR processing apparatus 100 is subjected to a thermal treatment by a thermal treatment apparatus such that the AFS is decomposed and removed.

As described above, in accordance with the embodiment of the present disclosure, it is possible to perform, using the single exhaust mechanism, the substrate process for two sheets of the wafers loaded into the respective processing parts under different gas supply conditions.

Further, in the above embodiment, the COR process has been described to be performed based on the combination of the HF gas and the $NH_3$ gas, but may be performed based on the HF gas alone or the $NH_3$ gas alone using the substrate processing apparatus of FIG. 1. As an example, the on-off valves 151a, 151b, 151c and 151d are opened while the on-off valves 151e, 151f, 151g and 151h are closed such that the HF gas diluted with the Ar gas is supplied into respective processing parts. Such diluted gases are used in the common substrate process mode S2-1. Thereafter, in the independent substrate mode S2-2, the on-off valves may be controlled as described in the following Case D, for example.

[Case D]
<For the gas introduction member 12a>
On-off valve 151a (Ar gas): opened
On-off valve 151c (HF gas): opened
On-off valve 151e ($N_2$ gas): closed
On-off valve 151g ($NH_3$ gas): closed
<For the gas introduction member 12b>
On-off valve 151b (Ar gas): opened
On-off valve 151d (HF gas): closed
On-off valve 151f ($N_2$ gas): closed
On-off valve 151h ($NH_3$ gas): closed <Configuration of Chamber>

Figure 8A:
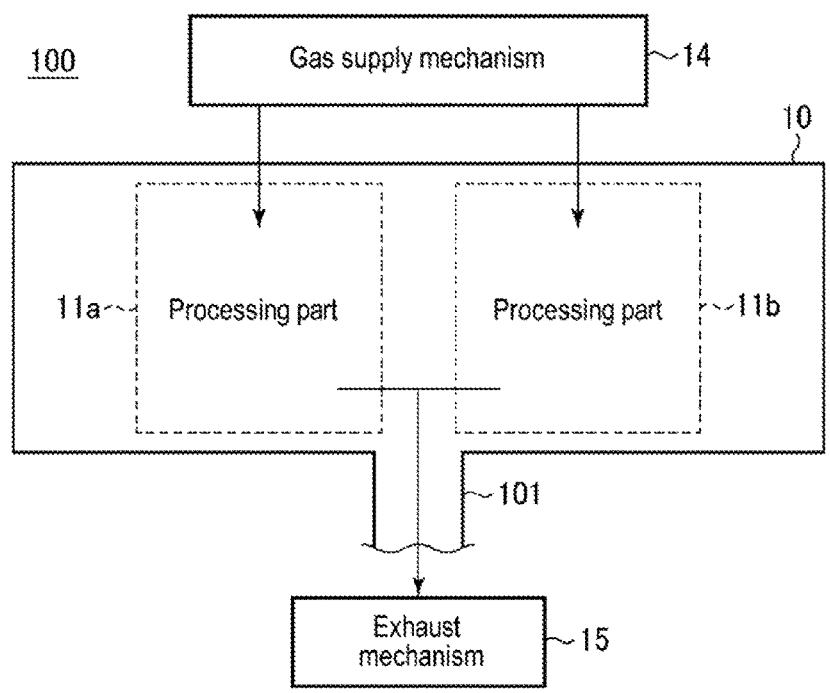
FIG. 8A is a view schematically showing an example of a configuration of a chamber of the substrate processing apparatus in accordance with the embodiment of the present disclosure.
Figure 8B:
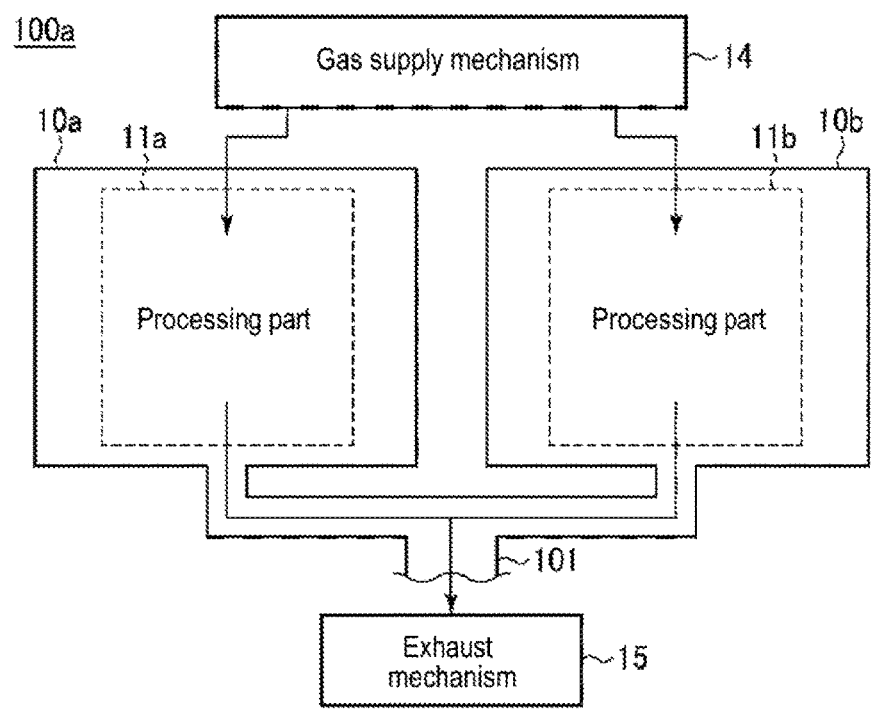
FIG. 8B is a view schematically showing another example of a configuration of a chamber of a substrate processing apparatus in accordance with another embodiment of the present disclosure.

FIG. 8A is a view schematically showing one example of a configuration of the chamber 10 of the COR processing apparatus 100 according to the above embodiment, and FIG. 8B is a view schematically showing another example of a configuration of a chamber of the COR processing apparatus 100a according to another embodiment.

In the COR processing apparatus 100 of FIG. 1, as shown in FIG. 8A, the processing parts 11a and 11b are installed in the single chamber 10, and the exhaust mechanism 15 is installed to be shared by both the processing parts 11a and 11b installed in the single chamber 10. The configuration of FIG. 8A is not limited to the COR processing apparatus 100 of FIG. 1, and may be applied to another apparatus which includes two processing parts capable of separately performing the substrate process within a single chamber.

Further, the present disclosure is not limited to the configuration in which the processing parts 11a and 11b are installed in the single chamber 10 as shown in FIG. 8A. In some embodiments, as shown in the COR processing apparatus 100a of FIG. 8B, the processing parts 11a and 11b may be installed in separated chambers 10a and 10b independently of each other, while the exhaust mechanism 15 may be shared by the separated chambers 10a and 10b.

Even when the processing parts 11a and 11b are installed in the separated chambers 10a and 10b independently of each other, the processing parts 11a and 11b are connected to each other through the exhaust pipe 101. In this configuration, when the supply of the gases to any one of the processing parts 11a and 11b is stopped, a difference between the internal pressures of the processing part 11a and the processing part 11b through the exhaust pipe 101 is caused. As such, as in the case where the processing parts 11a and 11b are installed in the single chamber 10, the gases flow between the processing parts 11a and 11b.

Even when the processing parts 11a and 11b are respectively installed in the separated chambers 10a and 10b, the control part 16 controls the on-off valves 151a to 150h and MFCs 150a to 150h of the gas supply mechanism 14 to flow, e.g., the inert gases as "the pressure-control supplement gases", thus preventing the difference between the internal pressures of the processing part 11a and the processing part 11b from being increased; in some embodiments, thus making the processing parts 11a and 11b have the same internal pressure. With this configuration, even when the single exhaust mechanism 15 collectively exhausts the interiors of the processing parts 11a and 11b in the separated chambers 10a and 10b, it is possible to suppress the gases from flowing between the processing parts 11a and 11b, as in the COR processing apparatus 100 of FIG. 1.

<For Supplement Gases>

While in the above embodiment, the dilution gases for diluting the processing gases such as the HF gas and the $NH_3$ gas, i.e., the insert gases represented by the Ar gas and the $N_2$ gas, have been described to be used as the pressure-control supplement gases, the present disclosure is not limited thereto. In some embodiments, a non-reactive gas that does not react with an etching target film of each of the wafers Wa and Wb to be processed may be used as the supplement gases. Alternatively, a reactive gas may be used as long as it can control an internal pressure of each processing part without affecting the substrate process.

Further, while in the above embodiment, the dilution gases as the pressure-control supplement gases and the processing gases have been described to be simultaneously used during the substrate process, the present disclosure is not limited thereto. In some embodiments, a dedicated supplement gas may be used separately from the dilution gases which are used along with the processing gases. In this case, a supply source, a supply pipe, MFCs, and on-off valves which are designed specifically for the dedicated supplement gas, may be further installed in the gas supply mechanism 14.

<Other Applications>

For example, in the above embodiment, as an example in which the substrate process is performed on the plurality of processing parts under the different gas supply conditions, one of the plurality of processing parts has been described to be continuously subjected to the substrate process by the processing gases, while the other has been described to be not subjected to the substrate process. In some embodiments, the present disclosure may be applied to a case where the processing gases are supplied into the plurality of processing parts at different flow rates or a case where different processing gases are used.

Further, while in the above embodiment, the semiconductor wafer has been described to be used as the target substrate, the present disclosure is not limited thereto. In some embodiments, various types of substrates may be used as the target substrate.

Further, while in the above embodiment, the substrate processing apparatus has been described to include the two processing parts 11a and 11b as the plurality of processing parts, the number of the processing parts is not limited to two. In some embodiments, any substrate processing apparatus may be employed as long as it includes two or more processing parts without damaging the advantages of the present disclosure.

Further, while in the above embodiment, the COR processing apparatus 100 has been described to be used as the substrate processing apparatus, the present disclosure is not limited thereto.

According to some embodiments of the present disclosure, in performing a substrate process on a plurality of target substrates, a single exhaust mechanism is controlled to collectively exhaust a plurality of processing parts, and processing gases are controlled to be separately supplied into the plurality of processing parts, thus preventing a difference between internal pressures of the plurality of processing parts. Accordingly, it is possible to perform the substrate process on the plurality of target substrates in the respective processing parts under different gas supply conditions using the single exhaust mechanism.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus for performing a predetermined substrate process on a plurality of target substrates under a vacuum atmosphere, comprising:
   a plurality of processing parts installed within a single chamber and configured to perform the substrate process on the plurality of target substrates, respectively, each of the plurality of processing parts including a substrate mounting table on which one of the plurality of target substrates is mounted, a showerhead facing the substrate mounting table, and a cylindrical inner wall surrounding the substrate mounting table and the showerhead so as to define a process space located between the substrate mounting table and the showerhead;

a gas supply mechanism positioned outside the single chamber and configured to separately supply a processing gas and a pressure control gas to the plurality of processing parts, the gas supply mechanism including a processing gas supply pipe and a pressure control gas supply pipe which are connected to the showerhead of each of the plurality of processing parts, and each of the processing gas supply pipe and the pressure control gas supply pipe including flow rate controllers and on-off valves;

a single exhaust mechanism configured to collectively exhaust the processing gas and the pressure control gas within the plurality of processing parts, the single exhaust mechanism including an exhaust pipe connecting an exhaust port formed in a bottom portion of the single chamber with a vacuum pump via an automatic pressure control valve; and a control part as a process controller configured to control the gas supply mechanism and the single exhaust mechanism, wherein the control part performs a control to:
while the inside of the plurality of processing parts are collectively exhausted by the single exhaust mechanism,
supply the pressure control gas into the plurality of processing parts such that the internal pressure of the plurality of processing parts is stabilized to have the same level of pressure;
when the internal pressure of the plurality of processing parts is stabilized to have the same level of pressure, start supply of the processing gas into the plurality of processing parts, and supply the pressure control gas into the plurality of processing parts at a first flow rate, such that the predetermined substrate process is performed in the plurality of processing parts, the processing gas and the pressure control gas being different from each other; and
when the predetermined substrate process is terminated in at least one of the plurality of processing parts, stop the supply of the processing gas into the at least one of the plurality of processing parts, and supply the pressure control gas into the at least one of the plurality of processing parts at a second flow rate that is different from the first flow rate, while the processing gas continues to be supplied into the remaining of the plurality of processing parts and the pressure control gas continues to be supplied into the remaining of the plurality of processing parts at the first flow rate,
wherein the first flow rate and the second flow rate are non-zero and set such that a difference in internal pressure among the plurality of processing parts is prevented from occurring due to the stop of the supply of the processing gas.

2. The substrate processing apparatus of claim 1, wherein the control part is further configured to execute a first mode in which the single exhaust mechanism is controlled to collectively exhaust the processing gas within the plurality of processing parts and the flow rate controllers and the on-off valves are controlled separately such that a first gas as the processing gas is supplied to all the plurality of processing parts under the same gas supply condition, and a second mode in which the single exhaust mechanism is controlled to collectively exhaust the processing gas within the plurality of processing parts and the flow rate controllers and the on-off valves are controlled separately such that the first gas is supplied into some of the plurality of processing parts and a second gas as the processing gas is supplied into the other of the plurality of processing parts, the second gas being difference from the first gas, and in the second mode, the control part is further configured to separately control the flow rate controllers and the on-off valves of the gas supply mechanism to prevent the difference between the internal pressures of the plurality of processing parts.

3. The substrate processing apparatus of claim 2, wherein, in the second mode, the control part is further configured to separately control the flow rate controllers and the on-off valves of the gas supply mechanism to control a flow rate of the second gas which is supplied into the other of the plurality of processing parts to such a level that the difference between the internal pressures of the plurality of processing parts is prevented.

4. The substrate processing apparatus of claim 2, wherein the second gas includes at least one of an inert gas and a non-reactive gas which does not react with the target substrate.

5. The substrate processing apparatus of claim 4, wherein, in the second mode, the control part is further configured to separately control the flow rate controllers and the on-off valves of the gas supply mechanism to:
continuously supply the first gas into the some of the plurality of processing parts such that the target substrate in the some of the plurality of processing parts continue to be subjected to the substrate process, and
stop the supply of the first gas into the target substrate in the other of the plurality of processing parts to terminate the substrate process, and supply the pressure control gas into the other of the plurality of processing parts,
wherein the second gas is further used as the pressure control gas.

6. The substrate processing apparatus of claim 5, wherein, prior to the substrate process, the control part is further configured to execute a pressure stabilization step of supplying the pressure control gas into the plurality of processing parts to stabilize the internal pressures of the plurality of processing parts by separately controlling the flow rate controllers and the on-off valves of the gas supply mechanism,
in the pressure stabilization step, the control part is further configured to control the flow rate of the pressure control gas by separately controlling the flow rate controllers and the on-off valves of the gas supply mechanism such that the pressure control gas flows toward the single exhaust mechanism, the pressure control gas serving to prevent a backward flow of the first gas and the second gas between the plurality of processing parts in the second mode.

7. The substrate processing apparatus of claim 6, wherein the pressure control gas is supplied into the plurality of processing parts in the substrate process, and
wherein the flow rate of the pressure control gas in the pressure stabilization step is set to be higher than a flow rate of the pressure control gas in the substrate process.

8. The substrate processing apparatus of claim 7, wherein the flow rate of the pressure control gas in the pressure stabilization step is set to be three times or more of those of some of the gases in the substrate process.

9. The substrate processing apparatus of claim 4, wherein the second gas includes a gas used in diluting the first gas.

10. The substrate processing apparatus of claim 1, wherein the single exhaust mechanism is shared by the plurality of processing parts installed within the single chamber.

* * * * *